United States Patent
Zhuang et al.

(10) Patent No.: US 6,602,395 B1
(45) Date of Patent: Aug. 5, 2003

(54) PATTERNING OF POLYMER LIGHT EMITTING DEVICES USING ELECTROCHEMICAL POLYMERIZATION

(75) Inventors: Zhming Zhuang, Wheeling, IL (US); Leslie F. Warren, Jr., Camarillo, CA (US); George M. Williams, Thousand Oaks, CA (US); Jeffrey T. Cheung, Thousand Oaks, CA (US)

(73) Assignee: Innovative Technology Licensing, LLC, Thousand Oaks, CA (US)

( * ) Notice: Subject to any disclaimer, the term of this patent is extended or adjusted under 35 U.S.C. 154(b) by 0 days.

(21) Appl. No.: 09/546,783

(22) Filed: Apr. 11, 2000

(51) Int. Cl.⁷ .............................. C25D 9/02; H01L 27/15
(52) U.S. Cl. ........................................ 205/317; 204/492
(58) Field of Search .................................. 205/317, 414, 205/422, 423, 424; 204/489, 492

(56) References Cited

U.S. PATENT DOCUMENTS

| | | | |
|---|---|---|---|
| 5,142,343 A | | 8/1992 | Hosokawa et al. ............ 357/17 |
| 5,485,294 A | * | 1/1996 | Sugiyama et al. ............. 359/58 |
| 5,980,349 A | | 11/1999 | Hofmann et al. ............. 445/26 |
| 6,294,245 B1 | * | 9/2001 | Roitman et al. ............ 428/212 |

OTHER PUBLICATIONS

J.L. Bredas, "*Electronic Structure of Highly Conducting Polymers*", "Handbook of Conducting Polymers, vol. 2", Chapter 25, pp. 859–913, T.J. Skotheim, Editor, Marcel Dekker, Inc., New York, 1996. Month of Publication Not Available.

A.F. Diaz and J. Bargon, "*Electrochemical Synthesis of Conducting Polymers*", "Handbook of Conducting Polymers, vol. 1", Chapter 3, pp. 81–115, T.J. Skotheim, Editor, Marcel Dekker, Inc., New York, 1986. Month of Publication Not Available.

F. Larmat, et al., "*Comparative Reactivity of Thiophene and 3,4–(Ethylenedioxy) Thiophene as Terminal Electropolymerizable Units in Bis–Heterocycle Arylenes*", Journal of Polymer Science: Part A, vol. 35, pp. 3627–3636, 1997. Month of Publication Not Available.

G.A. Sotzing, et al, "*Multiply Colored Electrochemical Carbazole–Based Polymers*", Chemistry of Materials, vol. 9, pp. 1578–1587, 1997. Month of Publication Not Available.

G. Wang, et al., "*Application of Polymers to Electroluminescence*", "Photonic Polymer Systems", D.L. Wise,et al., Editors, Chapter 7, pp. 217–267, Marcel Dekker, Inc., New York, 1998. Month of Publication Not Available.

X–C. Li, et al., "*Semiconducting Polymers as Light Emitting Materials*" "Photonic Polymer Systems", D.L. Wise, et al., Editors, Chapter 10, pp. 335–371, Marcel Dekker, Inc., New York, 1998. Month of Publication Not Available.

M. Sato, et al., "*Soluble Conducting Polythiophenes*", Journal of the Chemical Society, Chemical Communications, pp. 873–874, 1986. Month of Publication Not Available.

K. Kaeriyama, "*Synthesis and Properties of Poly (p–phenylene) and Its Derivatives*", "Photonic Polymer Systems," D.L. Wise, et al., Editors, Chapter 2, pp. 33–60, Marcel Dekker, Inc., New York, 1998.

(List continued on next page.)

*Primary Examiner*—Roy King
*Assistant Examiner*—William T. Leader
(74) *Attorney, Agent, or Firm*—Koppel, Jacobs, Patrick & Heybl; Michael J. Ram

(57) ABSTRACT

Light emitters are formed and patterned on an electrode for an organic light-emitting device by electrochemically polymerizing a monomer across the full length of the electrode. A second electrode is deposited so to define a pixel region between mutually aligned portions of the two electrodes. Electroluminescence of the emitter occurs when a voltage is applied across the electrodes of the device.

12 Claims, 6 Drawing Sheets

OTHER PUBLICATIONS

L. Rothberg et al., "*Status of and Prospects for Organic Electroluminescence*", Commentaries and Reviews, J. Mater. Res. vol. 11, No. 12, pp. 3174–3187, Bell Laboratories, Lucent Technologies, Murray Hill, New Jersey, Dec. 1996.

W.-P. Chang, et al., *Characteristics of an Electropolymerized PPV and Its Light–Emitting Diode*, Polymer, vol. 37, No. 9, Institute of Materials Science and Engineering, National Chiao Tung University, Hsinchu Taiwan, Ruplic of China, pp. 1513–1518, 1996 Month of Publication Not Available.

Aisaka Tetsuya, *Electroluminescence Element and Its Manufacture,* (C)1995, JPO, pp. 1–6 Month of Publication Not Available.

Seiji Inaoka, Daniel B. Roitman and Rigoberto C. Advincula, *Patterning and Electrochemical Deposition of Conjugated and Conducting Polymers in Organic Light Emitting Diodes,* Polymer Preprints 2000, 41(1), pp. 808–809. Month of Publication Not Available.

P. Damlin, T. Ostergard, A. Ivaska, H. Stubb, *Light–Emitting Diodes of Poly(P–Phenylene Vinylene) Films Electrochemically Polymerized by Cyclic Voltammetry on Ito,* Synthetic Metals 102 (1999) 947–948. Month of Publication Not Available.

T. Ostergard, C. Kvarnstrom, H. Stubb, A. Ivaska, *Electrochemically Prepared Light–Emitting Diodes of Poly (Para–Phenylene)*, Thin Solid Films 311 (1997) 58–61. Month of Publication Not Available.

Fernando Larmat, et al, *Comparative Reactivity of Thiophene and 3,4–(Ethylenedioxy) Thiophene as Terminal Electropolymerizable Units in Bis–Heterocycle Arylenes,* 1997, vol. 35, pp. 3627–3636. Month of Publication Not Available.

Gregory A. Sotzing, et al, *Multiply Colored Electrochromic Carbazole–Based Polymers,* Chem.Mater. 1997, 9, pp. 1578–1587. Month of Publication Not Available.

* cited by examiner

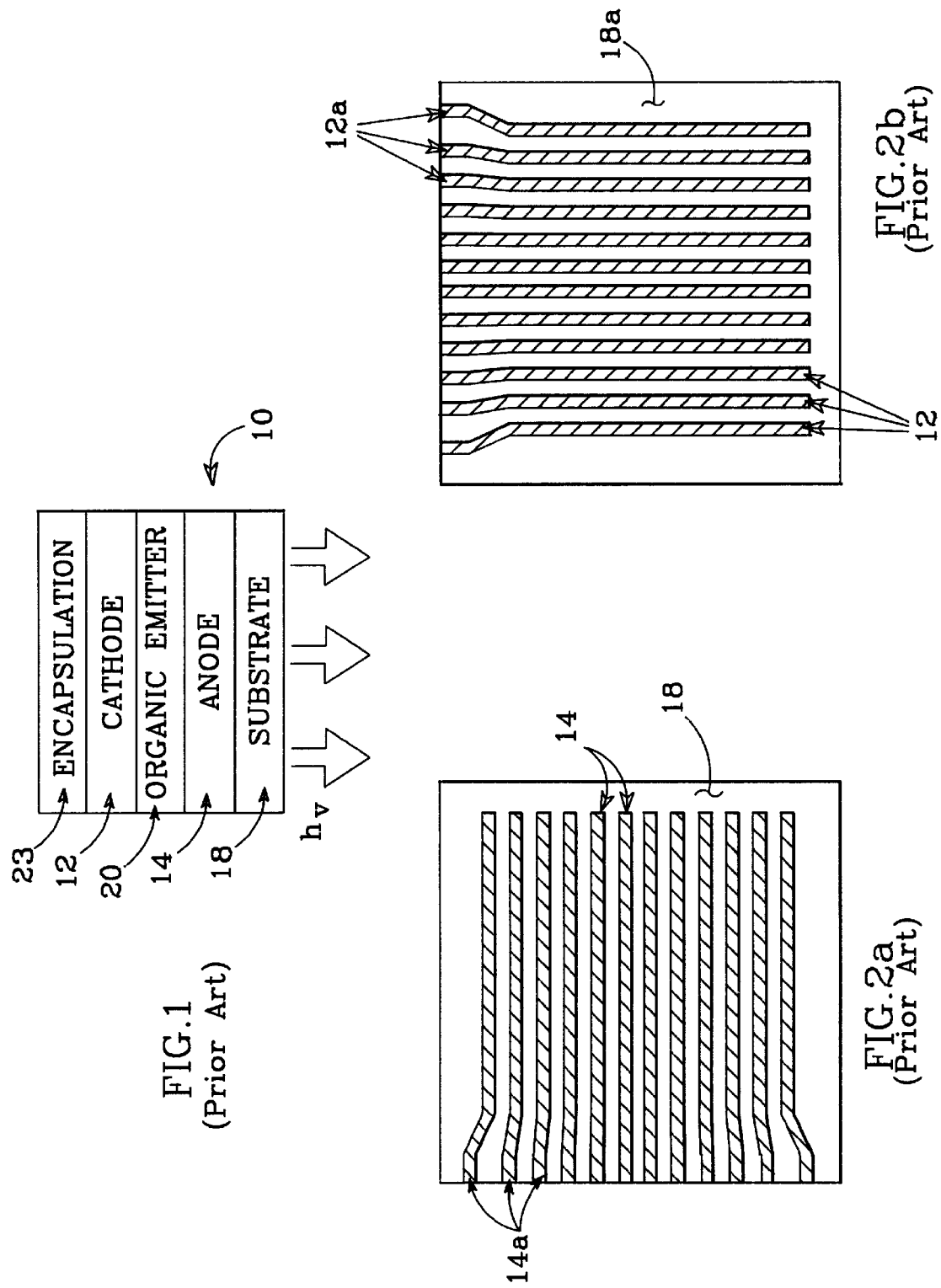

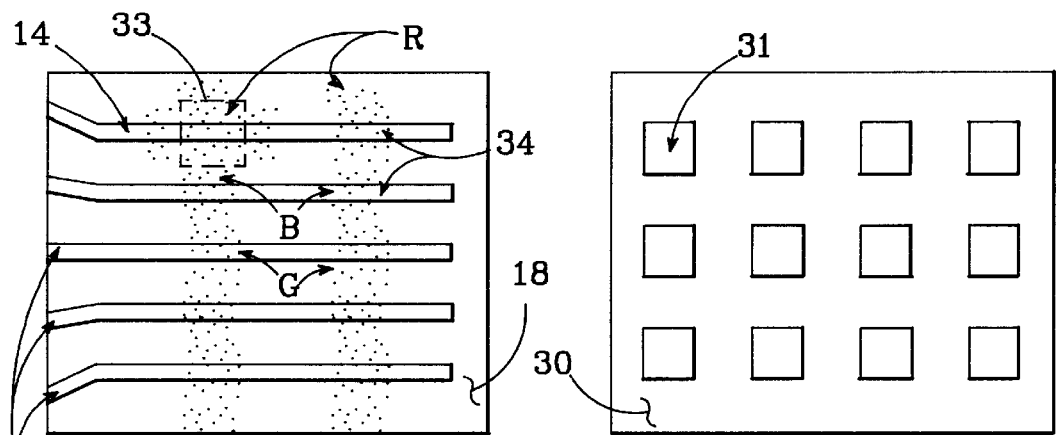
FIG.3a (Prior Art)
FIG.3b (Prior Art)
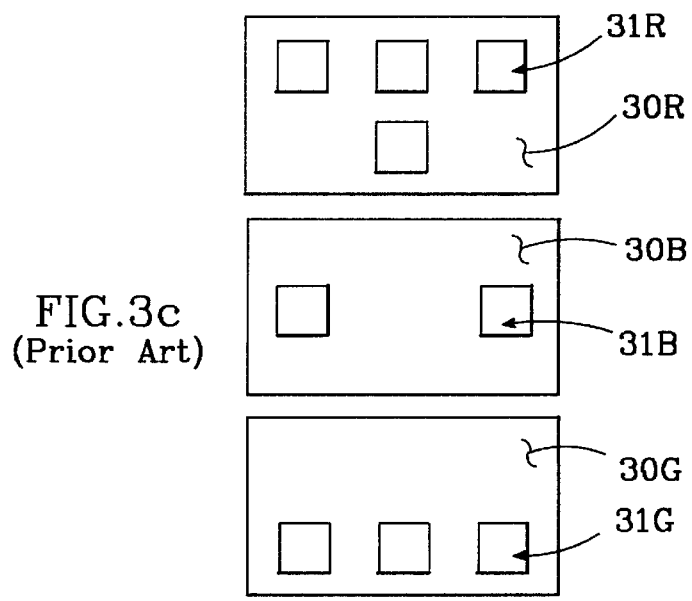
FIG.3c (Prior Art)
FIG.3d (Prior Art)

OLED 100

PATTERNING OF POLYMER LIGHT EMITTING DEVICES USING ELECTROCHEMICAL POLYMERIZATION

BACKGROUND OF THE INVENTION

1. Field of the Invention

The present invention relates to a method of patterning polymeric organic light emitters onto the substrate of an organic light emitting diode (OLED) using electrochemical polymerization, and to the resulting OLED device.

2. Description of the Related Art

OLEDs are known, and have been used for various types of displays. FIG. 1 illustrates a general overview of a portion of an OLED 10. Device 10 has a cathode electrode 12 that is spaced from a transparent anode electrode 14 deposited on a transparent substrate 18 which is typically comprised of glass or transparent plastic. Although only the anode electrode 14 is illustrated as transparent to allow light ho to pass through, the cathode electrode 12 or both the anode and cathode electrodes 14 and 12 may be transparent. An organic light emitter 20, which is capable of electroluminescence, is sandwiched between the cathode and anode electrodes 12 and 14. An encapsulating layer 23 may then be deposited on top of cathode electrode 12 to protect device 10 from the environment.

The organic emitter 20 has been comprised of electroluminescent thin films of either small discrete molecules such as aluminum tris(8-hydroxyquinoline) ($Alq_3$) or dye-doped $Alq_3$, or certain polymers. Different organic emitters emit different color light. For example, the $Alq_3$ molecule emits green light. The cathode electrode 12 is usually a low work function metal such as an alkaline earth metal or reactive metal alloy. Examples of cathode electrodes include calcium, magnesium/silver, and aluminum/lithium. Typically, the anode electrode 14 is a high work function thin film of transparent indium tin oxide (ITO). Other materials used may be polyaniline or fluorine-doped tin oxide. Semitransparent metal films have also been used, although they tend to be less transmissive at thicknesses that are suitably conductive for electrodes. The phrase "work function" refers to the energy difference, in electron volts (eV), between a free electron and an electron at the Fermi level of the material. The "Fermi level" is the energy level at which the probability that an energy state is occupied is equal to one-half.

Referring back to FIG. 1, forward biasing device 10 (placing a higher voltage on the anode electrode 14 than on cathode 12) causes current to flow through the organic emitter 20. This current flow enables the recombination of holes injected at the anode electrode 14 with electrons injected from the cathode electrode 12 within the organic emitter, generating light hυ in all directions, that is, electroluminescence. The light transmitted out to the sides of the device is lost and the light that hits the cathode is reflected. The output light hυ is transmitted through the transparent anode 14 and the substrate 18.

FIGS. 2A and 2B illustrate in detail the electrodes of the OLED shown in FIG. 1. FIG. 2A illustrates a well-known pre-patterned transparent substrate 18 having parallel rows of transparent anode electrodes 14 deposited thereon. FIG. 2B illustrates parallel columns of deposited cathode electrodes 12 on a substrate 18A. Although both the anode electrodes 14 of FIG. 2A and the cathode electrodes. 12 of FIG. 2B are illustrated as straight strip patterns, other patterns may also be used. If rows and columns are used, then the electrodes are normally oriented orthogonal to each other. The intersection of an anode electrode 14 with a cathode electrode 12 defines a single pixel. All of the pixels together form a matrix from which images can be formed by illuminating desired pixel patterns. Respective leads 14a and 12a in a conventional matrix-addressing scheme electronically address the anodes and cathodes.

There are two common methods for the deposition (or patterning) of organic light emitters onto a substrate with a pre-patterned electrode, such as substrate 18 with pre-patterned anode electrodes 14. Both methods are similar in that emitter 20 is deposited as a corresponding matrix of discrete pixel elements in registration with the pixels defined by the electrodes. The choice of deposition method however, will depend upon the type of organic emitter used.

As mentioned above, the two main groups of organic emitters in common use are discrete molecules and polymers. For discrete molecules such as $Alq_3$ or dye-doped $Alq_3$, the preferred technique is vapor deposition through a mask (commonly referred to as masking). Ink jet printing is commonly used for polymeric organic emitters. Both methods are well known.

FIG. 3A illustrates the deposition of organic emitters R, B, and G (Red, Blue, and Green) onto the electrodes 14 of substrate 18 using the masking method. Masking uses a metal plate 30 (illustrated in FIG. 3B) with patterned openings 31 which are commensurate in pattern and number with the specific pattern and number of pixels that are to be deposited; conventional OLED displays can have millions of pixels. For a full color spectrum, at least three different masks 30R, 30B, and 30G (shown in FIG. 3C) may be used to deposit three different organic emitters, each with its own color emission characteristic, onto different sets of electrodes 14. Discrete organic emitter molecules that emit the desired colors are deposited through the mask openings onto the desired pixel areas of the underlying electrodes 14. Red emitter is deposited through openings 31R in mask 30R, blue emitter through openings 31B in mask 30B, and green emitter through openings 31G in mask 30G. The masks are placed as close to the substrate 18 as possible without touching it, to avoid disrupting the organic emitters previously deposited on the electrodes 14.

A drawback of masking is that the deposition areas 33 (shown within dashed lines in FIG. 3A) tend to be larger than the actual mask openings 31. Because the mask 30 does not touch the substrate 18, molecules passing through its openings 31 are diffused sideways through the gap between the mask 30 and the substrate 18, and are deposited on areas beyond the boundaries of the openings 31. With this method, there is a lack of control over exactly where the individual organic emitter molecules are deposited. This imprecise deposition (or patterning) can create overlaps 34 of different organic emitter molecules having different color emission characteristics onto the same pixel.

To overcome this problem, efforts have been made to place the mask 30 as close to the substrate 18 as possible and to reduce the size of the mask openings 31. However, since some gap is still required between the mask 30 and substrate 18 to avoid damage, spreading of the organic emitter molecules can still occur. While reducing the size of the mask openings 31 reduces the spreading problem, it also reduces the amount of light generated while increasing the spacing between pixels. Another proposal is to reduce the number of pixels and increase their size. While this could reduce or eliminate overlapping depositions, it would also reduce the resolution of the device.

FIG. 3D is a magnified illustration of a pixel 35 (shown within dashed lines), defined by the intersection of the anode 14 and cathode 12 electrodes, which is deposited with an organic emitter using the masking method. Pure color emission might not be possible if there is an overlap 34 of two or more different molecules with different color emission characteristics on the pixel region 35.

FIG. 4A illustrates the deposition of polymeric organic emitters R, B, and G onto electrodes 14 of substrate 18 using the ink jet method. With ink jet printing the polymeric organic emitter with the desired color emission characteristic is first dissolved in a solvent such as xylene, and then dropped in a discrete non-continuous manner onto desired pixel locations on the electrodes 14. The emitter in the solvent is in liquid form, and therefore the emitter drops spread 37 upon contact with the electrodes 14. Drop thickness and the amount of spreading across the substrate 18 are difficult to control, producing colors with different emission characteristics from two adjacent pixels deposited with the identical polymer. FIG. 4B is a magnified illustration of pixels 40 and 41 (shown within the dashed lines), defined by the intersection of the anode 14 and cathode 12 electrodes, which are deposited with the identical polymeric organic emitter (R) using this method. The variation in both thickness and spreading of the deposited polymer (R) onto these two adjacent pixels 40 and 41 could generate light with two different color emission characteristics, such as intensities, resulting in poor resolution.

Both vapor deposition and ink jet printing lack direct, full control over the deposition of organic emitters. They produce imprecise, unpredictable patterns that result in poor resolution.

SUMMARY OF THE INVENTION

The present invention provides full and direct control over organic emitter deposition in an OLED device, eliminating imprecise and unpredictable patterning to achieve accurate control over both thickness and lateral dimensions. It does this by using electrochemical polymerization to direct organic emitter deposition onto desired areas of the electrode on the substrate.

The invention can be implemented with a substrate that is patterned with at least one electrode and submerged into an electrochemical bath or electrolyte. The electrolyte solution includes a solvent, a supporting electrolyte salt which conducts charge, and monomer molecules that function as a precursor to an electroluminescent polymer that is to be deposited onto desired selected electrodes. An electrochemically inert counterelectrode is placed in the solution bath parallel to and facing the electrode substrate. In response to a voltage differential applied across the counterelectrode and desired selected electrodes on the substrate, a polymer is deposited onto the entire full length of the selected electrodes, with little or no overlap, spreading, or thickness variations. Although the technique is used to deposit polymeric organic emitters primarily onto anode electrodes, it may also be used in principle for cathodic deposition.

The invention can be implemented with certain conducting polymer precursor monomers, such as aromatic and heteroaromatic compounds which oxidize at relatively low anodic potentials to form polymeric electrical conductors, which, when reduced to their neutral forms, are electroluminescent. Examples can include derivatives of pyrrole, thiophene, furan, carbazole, and some electron-rich aromatics.

These and other features and advantages of the invention will be apparent to those skilled in the art from the following detailed description of preferred embodiments, taken together with the accompanying drawings, in which:

BRIEF DESCRIPTION OF THE DRAWINGS

FIG. 1 is a sectional view illustrating a typical organic light emission diode (OLED);

FIGS. 2A and 2B are plan views OLED substrates with anode and cathode electrode strips;

FIGS. 3A, 3B, 3C and 3D are plan views illustrating the prior art use of masking technique to deposit organic emitters;

DETAILED DESCRIPTION OF THE INVENTION

The present invention relates to a new and improved patterning technique for the deposition of polymeric organic light emitters onto the electrodes of an OLED device. More particularly, precise patterning of electroluminescent polymers is accomplished using electrochemical polymerization. It has been discovered that light emitting polymers that can be accurately deposited on an underlying electrode of a substrate are derived from monomers with two common features. (i) The monomers used should be anodically polymerizable, which generally requires an aromatic character (with alternating double bonds), to provide the polymerizability, and (ii) the resulting polymer derived from said monomer must have the desired semiconducting property and electroluminescence in its reduced form. In order to deposit polymeric organic emitters onto the cathode electrode, a monomer which cathodically polymerizes to form an electroluminescent polymer is required. At the present time, however, this type of monomer has not been identified. However, the technique works optimally for anode deposition because a class of monomers which will anodically polymerize to form potentially electroluminescent polymers is well known. Specific monomers that have been identified as suitable for this process include, among others, thiophene derivatives, a bis(2-thienyl) terminated fluorene (BTDF), and a bis(2-thienyl) terminated carbazole (BTDC). It is anticipated that additional monomers will be identified in the future.

Figure 4A:
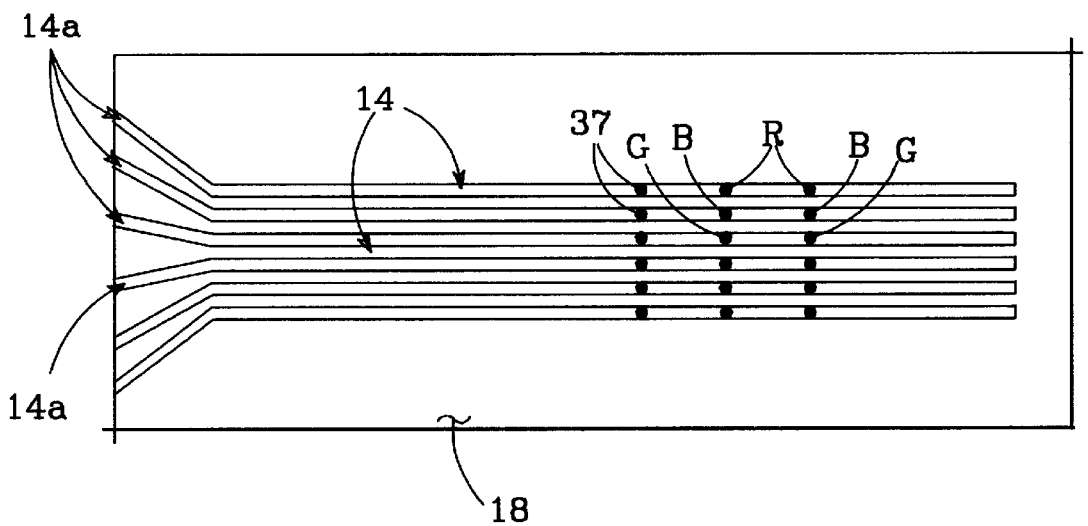
FIGS. 4A and 4B are plan views illustrating the prior art use of ink jet printing to deposit polymeric organic emitters.
Figure 4B:
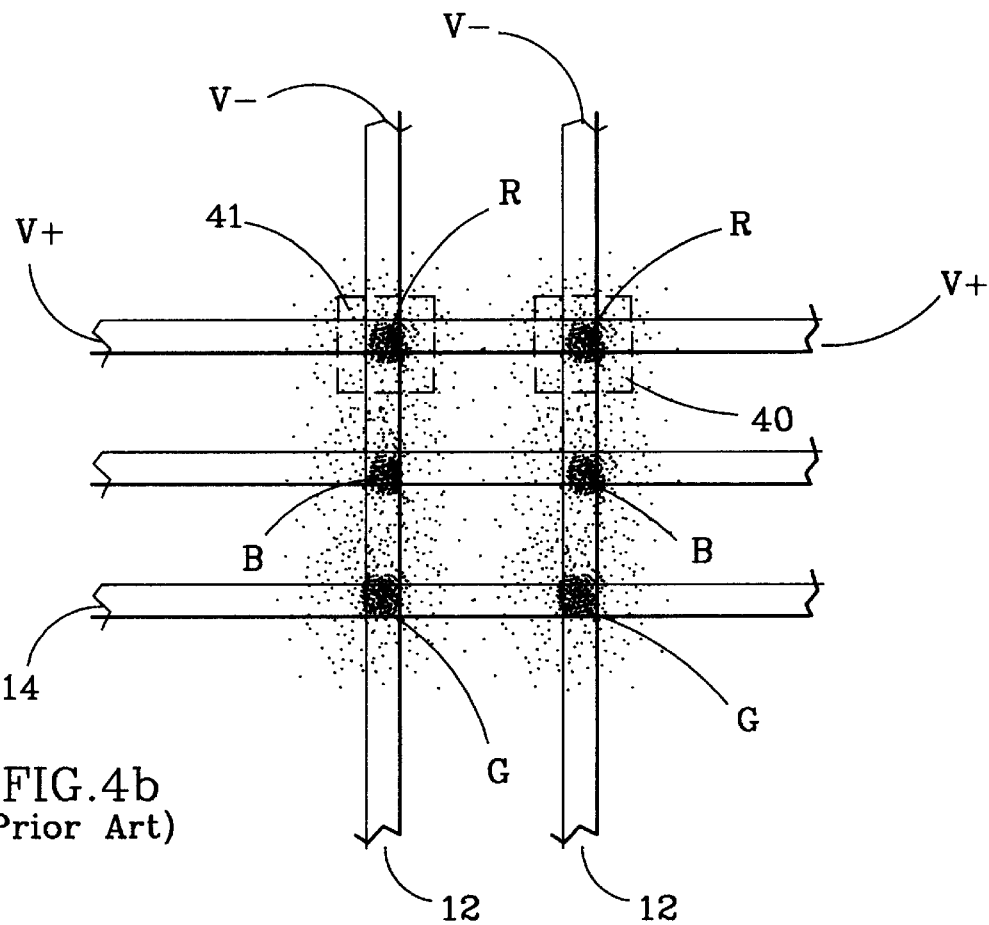
Figure 5:
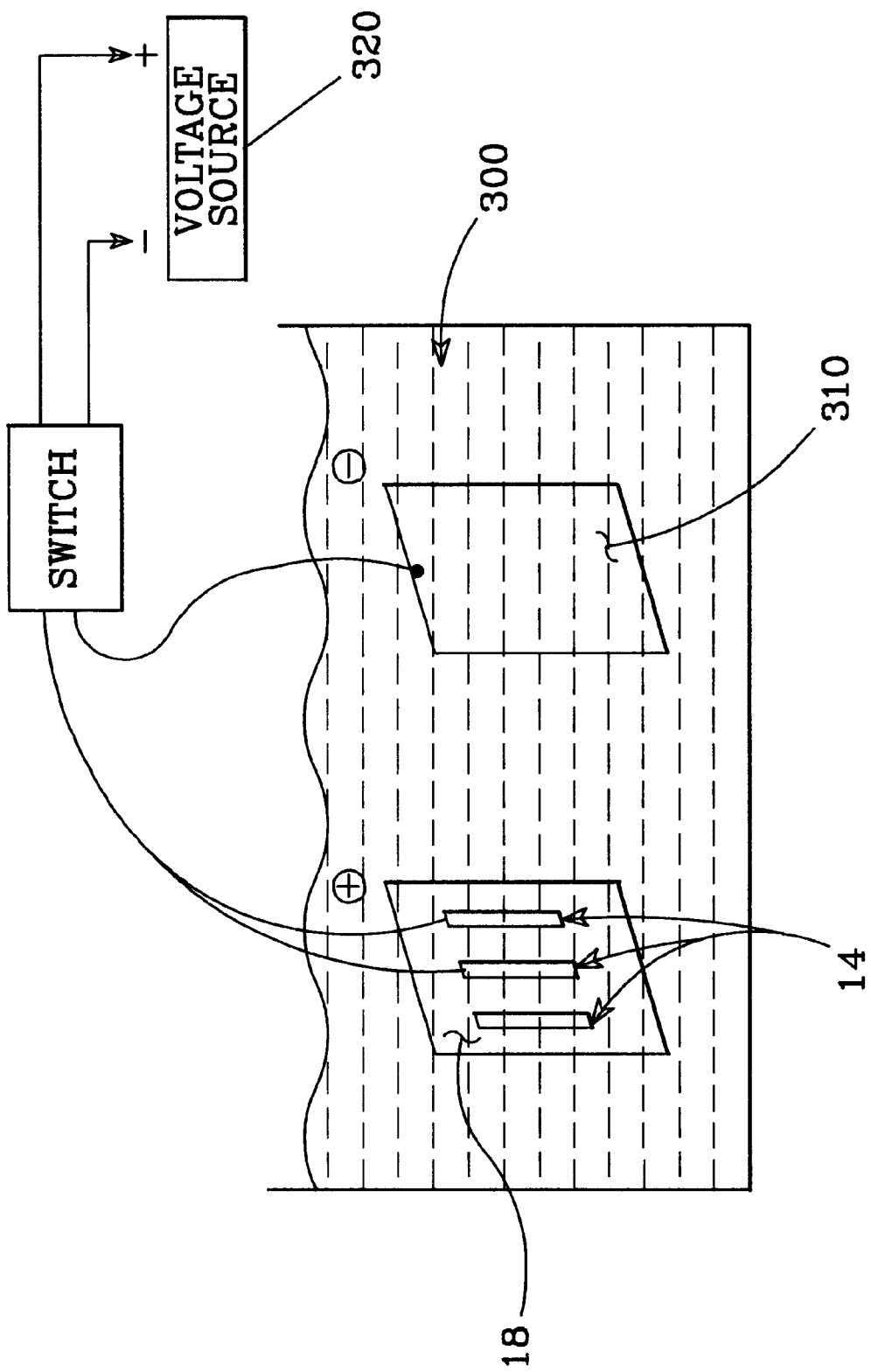
FIG. 5 is a block diagram illustrating a method of depositing polymeric light emitters in accordance with the invention.

Referring to FIG. 5, a substrate 18 pre-patterned with electrodes 14 is shown submerged in an electrochemical bath 300. A counterelectrode 310 is also submerged in the same solution bath 300, parallel to and facing substrate 18. The counterelectrode 310 is typically comprised of platinum or stainless steel or graphite. Bath 300 includes an electrolyte solution with dissolved monomer molecules that undergo an anodic electrochemical polymerization process. The electrolyte solution is used as a medium for the transfer of charge to oxidize the monomer forming a positively charged polymer deposit. A monomer is typically a small precursor molecule to the polymer that is deposited on the electrodes 14 of substrate 18 after the monomer has been oxidized. Various details for the different compositions of bath solution 300, different exemplary monomers used, and their respective electrochemical reactions will be described later.

Referring again to FIG. 5, a voltage supply source 320 is connected to provide a forward voltage across selected anode electrodes 14 of substrate 18 and the counterelectrode 310. In response to a voltage differential applied across these two electrodes, the monomer in bath 300 is oxidized, and deposited as a positively charged polymer only on the selected positively biased patterned anode electrodes 14. No polymer deposition takes place on substrate 18 outside the region of electrode 14. This polymer is electrically conductive, insoluble, and non-emitting. It is this conductive character that enables continued electrochemical growth of the polymer to a desired thickness. By contrast, an insulating polymer would passivate the electrode surface and essentially halt further growth. The deposition process may be expedited by the supply of higher current to the selected electrodes 14. Approximately 2 $\mu A/cm^2$ to 2 $mA/cm^2$ of current density is typically used during the polymerization process. In order to produce the final desired polymeric organic emitter, the positively charged polymer should be converted to the fully neutral uncharged form. The neutralization of the charged polymer is a two-step process, with an electrochemical reduction followed by a chemical reduction treatment. While still in the bath solution 300, the voltage previously applied to electrodes 14 and counterelectrode 310 is reversed with a positive voltage on the counterelectrode 310 and the negative voltage on the selected electrodes 14. The reverse bias voltage is applied for several minutes. This significantly reduces the positive charge on the deposited polymer. To fully neutralize the polymer, it is chemically treated by removing substrate 18 from the electrochemical solution bath 300, and immersing it in a reducing solution that preferably includes 2% hydrazine hydrate solution in acetonitrile, followed by a final rinse/soak in an inert solvent, such as acetonitrile. The electrochemical treatment of the polymers on electrodes for neutralization may be skipped, but performing both steps produces superior results.

Typical electrolyte solvents for electrolyte bath 300 could include those with potential windows that can accommodate the anodic oxidation potentials of the monomers. Acetonitrile, nitrobenzene, propylene carbonate, γ-butyrolactone, and dichloromethane are representative solvents that could be used. Also incorporated into bath 300 is a supporting electrolyte salt(s), which contains anions that become incorporated in the initial electrochemically generated polymer as "dopant" anions. These salts are electrochemically stable and may include alkali metal ion or tetraalkylammonium perchlorate, hexafluorophosphate, tetrafluoroborate, p-toluenesulfonate, and $(CF_3SO_2)_2N^-$ salts and the like. Typical concentrations of these salts in bath 300 could range from about 10 mM to 0.1 M. Concentrations of the monomers in these electrolytes range from about 1 mm to 0.2 M.

Photoluminescence may then be used to determine if the positively charged polymer on the electrodes has been fully neutralized. In this process, the polymer is exposed to. ultraviolet light, the absorption of which may cause emission of energy, usually in the form of radiation in the visible portion of the spectrum, if the polymer is fully converted to the neutral form and has the appropriate electronic structure.

As mentioned above, the monomers that may be used as precursors to electrodepositable electroluminescent (EL) polymer emitters generally possess two key features. They must be electrochemically, generally anodically (oxidatively), polymerizable allowing for selective deposition (patterning) of their polymers. In general, the monomers used most likely are electron-rich and possess highly conjugated aromatic structures (due to their alternating double bonds), which can give them the property of polymerizability and provide the desired semiconducting property to their polymers. The electronic structures of this class of monomers and their polymers are discussed in detail by J. L. Bredas, "Electronic Structure of Highly Conducting Polymers," in "Handbook of Conducting Polymers, volume 2," chapter 25, pp. 859–913, T. J. Skotheim, editor, Marcel Dekker, Inc., New York, 1986. A further key property of the monomers used for this application is the requirement that after monomer oxidation and neutralization of the resulting polymer, the resulting polymers should in general possess the property of electroluminescence (EL). EL requires both a semiconductor character found with this class of electrodeposited polymers and the property of photoluminescence (PL) as well. PL is conveniently used as a qualitative marker to determine if the electrodeposited polymer has been fully neutralized and has electroluminescent potential. In some cases, the monomers may be also photoluminescent, but not in all cases. The electronic properties of electrodeposited electroluminescent/photoluminescent polymers have not been fully elucidated at this time.

Monomers which electrochemically polymerize to form polymeric electrical conductors may be found in certain aromatic and, particularly, heteroaromatic compounds which oxidize at relatively low anodic potentials. The family of electrodeposited conducting polymers derived from heteroaromatic compounds is well known. See, for example, A. F. Diaz and J. Bargon, "Electrochemical Synthesis of Conducting Polymers," in "Handbook of Conducting Polymers, volume 1," chapter 3, pp. 819–115, T. J. Skotheim, editor, Marcel Dekker, Inc., New York, 1986, for a description of these systems. Typical examples of heteroaromatic monomer compounds include pyrrole, thiophene, furan, carbazole, and derivatives thereof, although the vast majority of their polymers are not light emitter candidates, failing to meet the photoluminescence/electroluminescence requirements.

The design of suitable monomers that will give rise to high efficiency polymer emitters having the property of electroluminescence is not straightforward. Nonetheless, we have discovered some electrodepositable polymer systems that exhibit photoluminescence. For example, we observed PL from a polymer originally synthesized by F. Larmat, et al., "Comparative Reactivity of Thiophene and 3,4-(Ethylenedioxy)thiophene as Terminal Electropolymerizable Units in Bis-Heterocycle Arylenes," in Journal of Polymer Science: Part A, volume 35, pp. 3627–3636, 1997, namely the polymer derived from BTDF monomer, a bis(2-thienyl) terminated fluorene. Another system showing PL was the polymer from a bis(2-thienyl) terminated carbazole, BTDC monomer, of the type first prepared by G. A. Sotzing, et al., "Multiply Colored Electrochromic Carbazole-Based Polymers," in Chemistry of Materials, vol. 9, pp. 1578–1587, 1997. While described in these publications as electrochromic materials, no PL or EL properties of the poly(BTDF) and poly(BTDC) polymers were taught or suggested by the authors. Nonetheless, this class of electropolymerizable bis-heterocycle arylene has considerable potential for new OLED emitters of the type described in this application.

A related nonelectrochemically derived polymeric electroluminescent emitter class, the poly(3-substituted thiophenes), has been reviewed by G. Wang, et al., "Application of Polymers to Electroluminescence," in "Photonic Polymer Systems," D. L. Wise, et al., editors, chapter 7, pp. 217–267, Marcel Dekker, Inc., New York, 1998, and by X-C. Li, et al. in "Semiconducting Polymers as Light Emitting Materials," in "Photonic Polymer Systems," D. L. Wise, et al., editors, chapter 10, pp. 335–371, Marcel Dekker, Inc., New York, 1998. While the materials in these publications were prepared chemically and deposited onto electrode surfaces from solution (e.g., by spin-coating), some have also been synthesized electrochemically in the past by M. Sato, et al., "Soluble Conducting Polythiophenes," in the Journal of the Chemical Society, Chemical Communications, pp. 873–874, 1986. None however, teach or suggest the selective patterning of electrodes by electrochemical deposition. Also, the family of aromatic (i.e., non-heteroaromatic) poly(p-phenylenes), several of which are electroluminescent and primarily prepared chemically (see K. Kaeriyama, "Synthesis and Properties of Poly(p-phenylene) and Its Derivatives," in "Photonic Polymer Systems," D. L. Wise, et al., editors, chapter 2, pp. 33–60, Marcel Dekker, Inc., New York, 1998) has anodically polymerized systems derived from dialkoxybenzenes which may fall into the category of electrodeposited emitters of this application.

Production of electrodeposited OLED emitters is exemplified in the scheme below using a heteroaromatic thiophene derivative as a representative example. Here, the soluble thiophene monomer is oxidatively polymerized in an electrochemical bath to an insoluble "doped" cationic polymer that deposits as a film on the (patterned) anode. This material is generally electrically conductive and non-emitting, i.e., showing no PL.

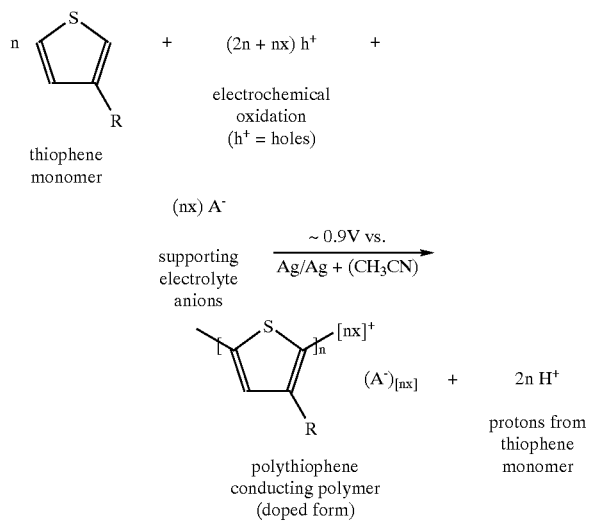

The as-deposited doped polymer film, where x is typically in the range 0.2 to 0.5, is then reduced electrochemically and/or chemically to the undoped, potentially emitting, neutral form of the polymer.

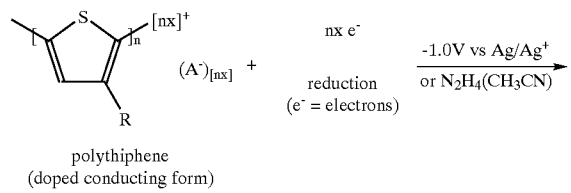

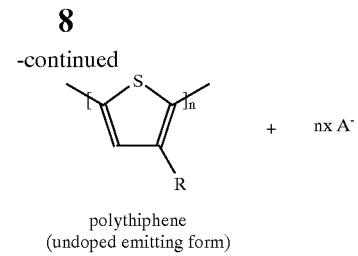

Related bis-heterocycle arylene monomers electropolymerize in an analogous fashion through their two heterocycle units. The structures of two of these materials, poly (BTDF) and poly(BTDC) described above (heterocycle= thienyl, arylene=fluorene, carbazole) are represented below.

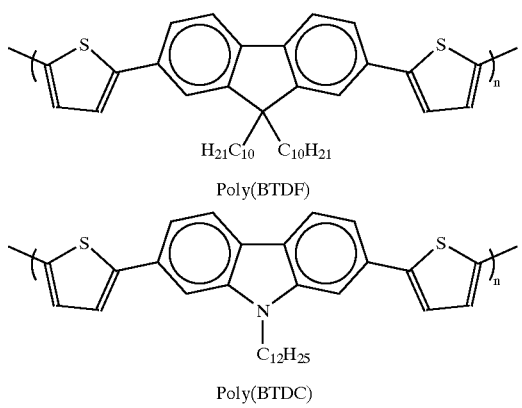

In these systems, the oxidative coupling of monomers to form polymers takes place through the two heterocycle thienyl (thiophene) substituents. The arylene unit, which is sandwiched between two heterocycle groups can be a conjugated functionality compatible with the oxidative polymerization reaction, such as a fluorene (an aromatic) or a carbazole (a heteroaromatic) in the examples above. By appropriate selection of the central arylene unit in these bis(heterocycle) arylene monomers, highly emissive polymers with desired color emissions may be designed. The arylene units can comprise aromatic, heteroaromatic, polynuclear aromatic, conjugated olefins, or mixtures thereof. The desired selections are based on the electroluminesence potential of the arylene units themselves. The heterocycle substituents that enable coupling of the monomer units may be thienyl, furanyl, pyrrolyl, or other electron-rich aromatic units. Alternatively, certain heterocycle monomers or oligomers by themselves can electrochemically generate potential electroluminescent polymers, as suggested for the poly(3-alkylthiophenes) by Wang and Li above.

Mixture of monomers with comparable oxidation potentials may also be used in the electrodeposition process to vary the color emission of a polymer. For example, the oxidation of a monomer 'RE' could produce a pure polymer "RE1" with a color emission characteristic of red. The oxidation of a second monomer 'BL' could produce a pure polymer 'BL1' with a color emission characteristic of blue. However, the oxidation of a mixture of the two monomers 'RE' and 'BL' could result in a polymer 'C1' with a color emission characteristic whose wavelength is different from those of the two pure polymers 'RE1' and 'BL1.' Depending on the ratio of monomer units within the resulting polymer, the color emission can be shifted in wavelength. The "mixture" may comprise at least one monomer, but is not limited to any number or ratios thereof.

Three representative examples of monomer classes that can be electropolymerized to polymeric electroluminescent emitters are shown below. ("$R_n$", where n=1,2, refers to alkyl or aryl substituents on the molecules.)

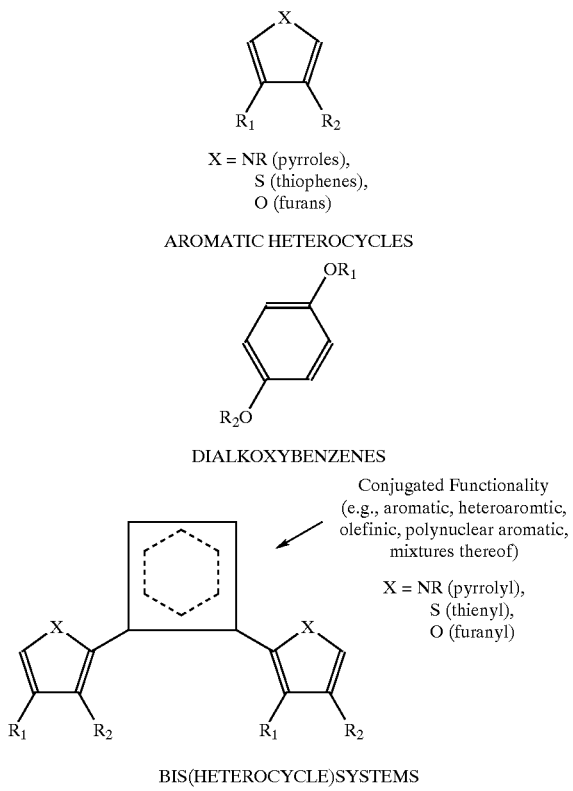

These examples are not meant to be all-inclusive, but merely representative of the desired class of electrodepositable emitter called out in this application. Likewise, should any cathodically electrodepositable polymer systems of the type described above be developed, these too could be candidates for electrochemical patterning of emitters.

Figure 6A:
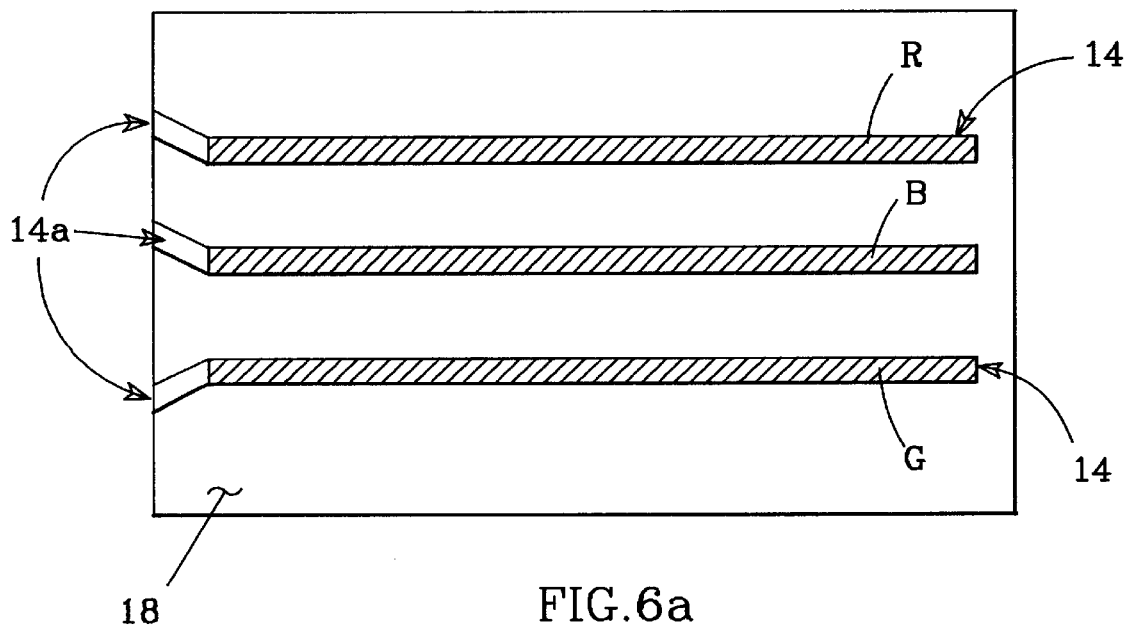
FIGS. 6A, 6B, and 6C are plan views illustrating final patterned polymeric organic light emitters.
Figure 6B:
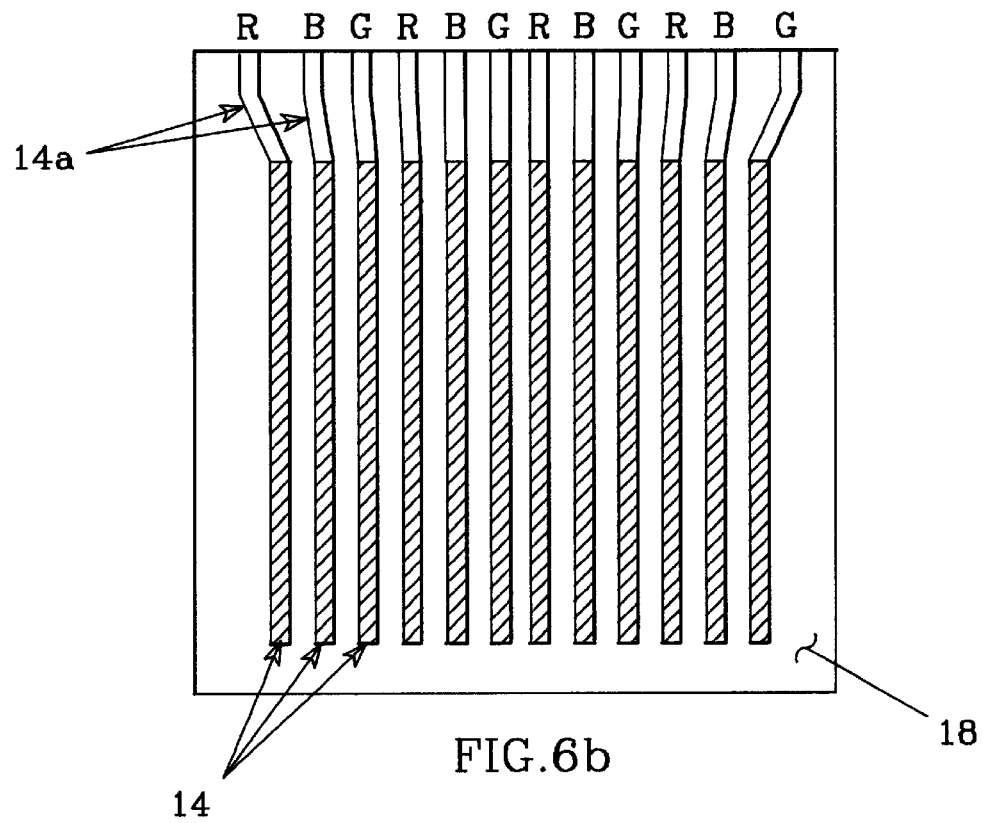

FIG. 6A illustrates three finally deposited polymeric organic emitters R, B, and G on three selected electrodes 14 of substrate 18. FIG. 6B illustrates four sets of selected electrodes, with three different color emitters R, B, and G per set. To provide a full color spectrum light emissive device, three different sets of emitters with color emission characteristics of red (R), blue (B), and green (G) are needed. The above process is repeated for each emitter set having its own color emission characteristic. A separate bath with the appropriate precursor monomer (or a mixture thereof) for the electrodeposited color emitter is used, and the voltage source 320 is connected only to the leads 14a for the electrodes upon which that particular monomer is to be polymerized.

Figure 6C:
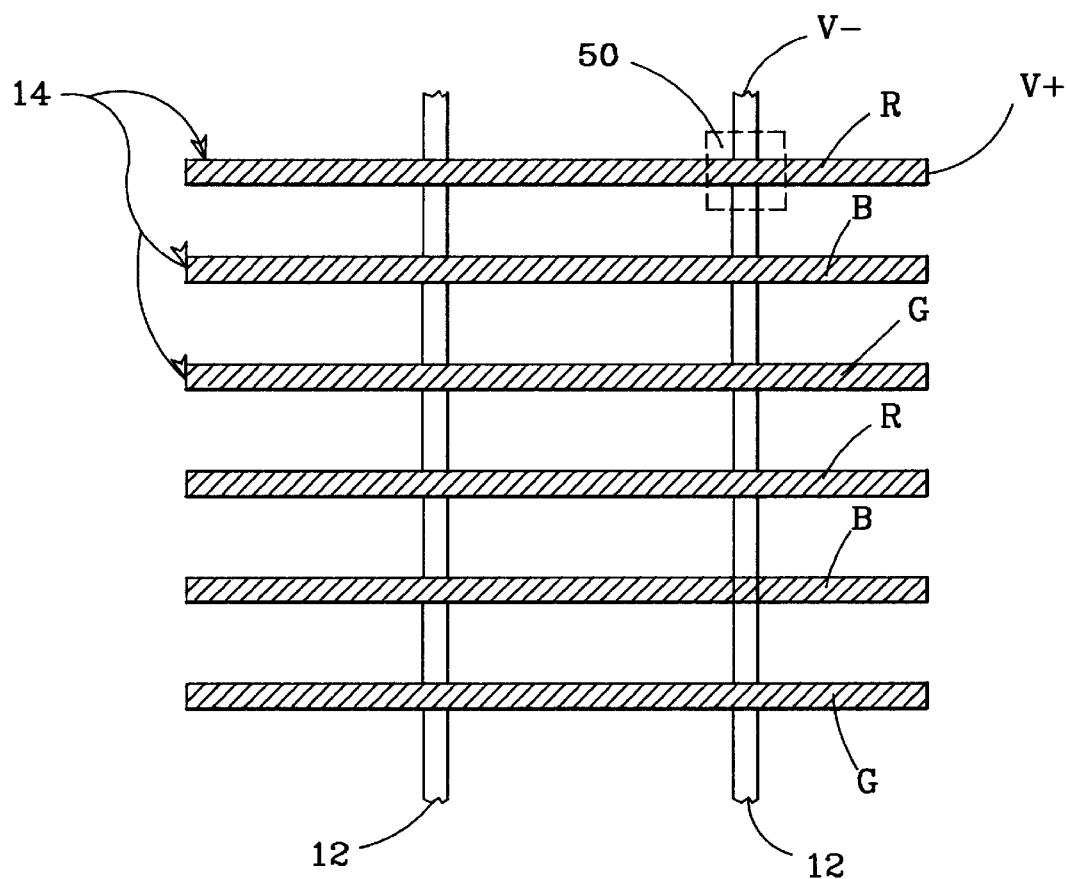

FIG. 6C is a magnified illustration of a pixel 50 (shown within the dashed lines), defined by the intersection of the anode 14 with cathode 12 electrodes, which is deposited with a polymeric organic emitter using electrochemical polymerization. Selective patterning of polymers R, B, and G using electrochemical polymerization results in no overlap, random thickness or spreading of these emitters, allowing pixel 50 to generate light with the desired color emission characteristic.

Figure 7:
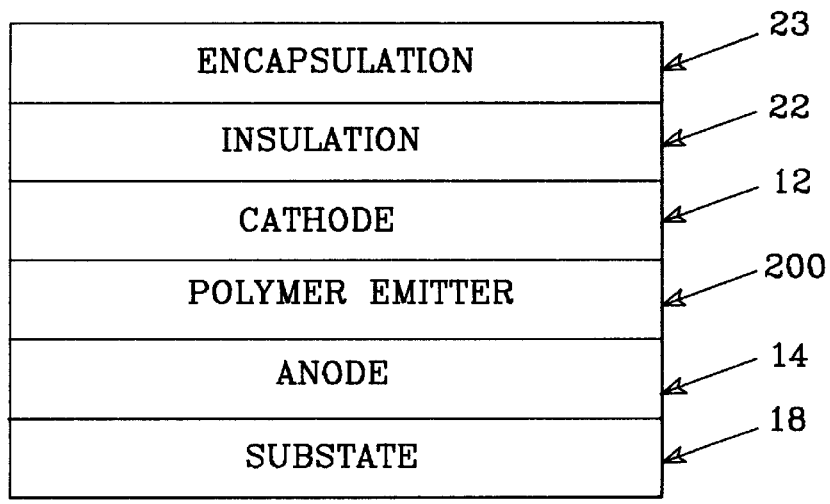
FIG. 7 is a sectional view of an OLED in accordance with the present invention.

FIG. 7 illustrates a completed OLED device 100 with deposition of cathode electrodes 12 on the separately deposited organic emitters 200, followed by encapsulation of the entire device 100. The substrate 18 is illustrated as transparent and is commonly comprised of glass or transparent plastic. There are varieties of well-known methods used to deposit the anode 14 and the cathode 12 electrodes. The methods employed may include, among others, vapor deposition, sputtering, or solvent casting (e.g. spin-coating), following by patterning. Anode 14 electrodes are usually etched into a desired pattern employing the well-known patterning technique of photolithography. The individually deposited polymeric organic emitters 200 are deposited separately onto a selected set of anode electrodes 14 of substrate 18 using electrochemical polymerization. (A set may contain one or more electrodes.) The cathode electrodes 12 are then deposited, for example, by evaporation onto emitters 200. The encapsulation layer 23, usually comprised of an epoxy cast, is sealed on top of the device 100, covering the entire device. This protects the device 100 from the outside environment. An insulation layer 22 can be placed between the cathodes 12 and the encapsulation layer 23, covering the entire device 100; this prevents contact between the cathodes 12 and the encapsulation layers 23.

EXAMPLE 1

The electrolyte solution comprised 1 mM bis(2-thienyl)-9,9-didecylfluorene (BTDF) monomer and 0.1M tetraethylammonium tetrafluoroborate (TEAFB) supporting electrolyte in γ-butyrolactone (GBL) solvent. The working electrode was a patterned 3 cm$^2$ area of 10 Ω/square indium tin oxide (ITO) on glass; the platinum sheet counter electrode had an area of 10 cm$^2$ and was disposed parallel to the working electrode in the electrolyte solution. The reference electrode was the Ag/Ag$^+$(CH$_3$CN) couple (0.01M AgNO$_3$. 0.1M TEAFB in acetonitrile) and was incorporated in a narrow tube with a porous Vycor frit that was immersed in the electrolyte solution. A standard three-electrode configuration was used, and potentials were measured/applied vs. the reference electrode by means of a Princeton Applied Research Model 273 potentiostat/galvanostat. A clear dark green polymer film deposited on the ITO when the working electrode was subjected to a constant anodic potential of +0.713 V vs. reference for a total charge of 87 mC (millicoulombs); the current remained at ca. 6 μA throughout the deposition. The film was then held at a cathodic bias of −1.0 V for 10 minutes before immersing in a 2% solution of hydrazine hydrate in acetonitrile, completely reducing the film to its neutral form. The resulting yellow film exhibited yellow-orange PL. Comparable results were observed with poly(BTDF) films deposited at a constant current of 2 μA/cm$^2$. A crude OLED device with the structure ITO/poly (BTDF)/Al was fabricated from the working electrode by evaporation of aluminum onto the polymer film. When current was passed through the device, a brief emission of light was observed.

EXAMPLE 2

An electrolyte solution was made comprising 1 mM bis(2-thienyl)-N-dodecylcarbazole (BTDC) and 0.1M TEAFB in GBL. In the same manner as example 1, poly (BTDC) was deposited onto an ITO working electrode at a constant potential of 0.50 V vs. Ag/Ag$^+$(CH$_3$CN) as a clear brownish film; charge passed during deposition corresponded to ca. 25 mC/cm$^2$. Upon electrochemical/chemical reduction, the resulting yellow film exhibited yellow PL. Comparable results were observed with poly(BTDC) films deposited at a constant current of 2 μA/cm$^2$.

EXAMPLE 3

Using a monomer mixture of 1 mM BTDF and 0.5 mM bithiophene in the electrolyte solution, a mixed polymer film was obtained by the procedure of example 1. The resulting orange (reduced) film exhibited an orange PL.

While several illustrative embodiments of the invention have been shown and described, numerous variations and alternate embodiments will occur to those skilled in the art. For example, an intervening transparent organic conductor layer which acts as a hole transport layer can be provided between the emitter and the underlying electrode if desired, rather than forming the emitter directly onto the ITO electrode. Another example would be to orient the electrode array in a non-parallel configuration to the counterelectrode, and provide a gradient among the voltage applied to the different electrodes. Such variations and alternate embodiments are contemplated, and can be made without departing from the spirit and scope of the invention as defined in the appended claims.

We claim:

1. A method of forming a light omitting layer on at least one elected electrode of an organic light emitting diode (OLED), comprising:
   a. exposing said at least one selected electrode to a precursor monomer of an electroluminescent polymer; and
   b. simultaneously electrochemically converting said precursor monomer to said electroluminecent polymer and depositing said polymer on said at least one selected electrode, wherein said precursor monomer is selected from the group consisting of a bis (2-thienyl) terminated fluorene and a bis (2-thienyl terminated carbazole and mixtures thereof.

2. The method of claim 1, wherein said electroluminescent polymer extends continuously along a full length of said at least one selected electrode.

3. The method of claim 1, wherein said precursor monomer is electrochemically oxidized to form said electroluminescent polymer on at least one selected electrode.

4. The method of claim 3, wherein said precursor monomer is oxidized to a cationic polymer form, and then reduced to its neutral electroluminescent polymer form, the electroluminescent polymer so formed also being photoluminescent.

5. The method of claim 4, wherein said mixture comprises a plurality of monomers having comparable oxidation potentials.

6. A method of fabricating an organic light emitting device comprising:
   a. patterning an electrode;
   b. selectively exposing said electrode to a precursor monomer of an electroluminescent polyrnmer;
   c. electrochemnically depositing said polymer on said electrode;
   d. patterning a second electrode onto said polymer on said electrode to define pixels between mutually aligned portions of said electrode and said second electrode; and
   e. encapsulating said electrode and said second electrode for protection from outside environment, wherein said precursor monomer is selected from the group consisting of a bis (2-thieryl) terminated fluorene and a bis (2-thienyl) terminated carbazole and mixtues thereof.

7. The method of claim 6, wherein one of said electrode and said second electrode is deposited on a substrate.

8. The method of claim 6, wherein said polymer extends continuously across pixel locations along a full length of one of said electrode and said second electrode.

9. The method of claim 6, wherein said electrochemical deposition of said polymer is done by oxidizing said monomer to a positively charged polymer, and reducing said positively charged polymer to said electroluminescent polymer.

10. The method of claim 6 wherein the precursor monomer is bis (2-thienyl)-9,9'-didecylfluorene.

11. The method of claim 6 wherein the precursor monomer is bis (2-thienyl)-N-dodecylcarbazole.

12. The method of claim 6 wherein the precursor monomer is a mixture of bis (2-thienyl)-9,9'-didecylfluorene and bis(2-thienyl)-9,9'-didecylfluorene.

* * * * *

UNITED STATES PATENT AND TRADEMARK OFFICE
CERTIFICATE OF CORRECTION

PATENT NO. : 6,602,395 B1
DATED : August 5, 2003
INVENTOR(S) : Zhming Zhuang et al.

It is certified that error appears in the above-identified patent and that said Letters Patent is hereby corrected as shown below:

Column 11,
Line 1, replace "omitting" with -- emitting --

Signed and Sealed this

Thirtieth Day of September, 2003

JAMES E. ROGAN
*Director of the United States Patent and Trademark Office*